United States Patent
Doczy et al.

(10) Patent No.: US 7,183,184 B2
(45) Date of Patent: Feb. 27, 2007

(54) METHOD FOR MAKING A SEMICONDUCTOR DEVICE THAT INCLUDES A METAL GATE ELECTRODE

(75) Inventors: Mark L. Doczy, Beaverton, OR (US); Justin K. Brask, Portland, OR (US); Jack Kavalieros, Portland, OR (US); Uday Shah, Portland, OR (US); Chris E. Barns, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 50 days.

(21) Appl. No.: 10/748,545

(22) Filed: Dec. 29, 2003

(65) Prior Publication Data

US 2005/0148130 A1    Jul. 7, 2005

(51) Int. Cl.
  *H01L 21/3205*    (2006.01)
(52) U.S. Cl. .................. 438/585; 438/299; 438/301; 438/303; 438/592; 438/595
(58) Field of Classification Search ............ 438/585, 438/299, 301, 303, 592, 595
See application file for complete search history.

(56) References Cited

U.S. PATENT DOCUMENTS

| | | | |
|---|---|---|---|
| 5,879,998 A | 3/1999 | Krivokapic | |
| 5,960,270 A * | 9/1999 | Misra et al. | 438/197 |
| 6,063,698 A | 5/2000 | Tseng et al. | 435/585 |
| 6,074,921 A | 6/2000 | Lin | |
| 6,184,072 B1 | 2/2001 | Kaushik et al. | 438/197 |
| 6,255,698 B1 | 7/2001 | Gardner et al. | 257/369 |
| 6,365,450 B1 | 4/2002 | Kim | |
| 6,365,474 B1 | 4/2002 | Finder et al. | |
| 6,410,376 B1 | 6/2002 | Ng et al. | 438/199 |
| 6,420,279 B1 | 7/2002 | Ono et al. | 438/785 |
| 6,475,874 B2 | 11/2002 | Xiang et al. | 438/396 |
| 6,514,828 B2 | 2/2003 | Ahn et al. | 438/240 |
| 6,544,906 B2 | 4/2003 | Rotondaro et al. | 438/785 |
| 6,579,784 B1 | 6/2003 | Huang | |
| 6,586,288 B2 | 7/2003 | Kim et al. | 438/183 |
| 6,617,209 B1 | 9/2003 | Chau et al. | 438/240 |
| 6,617,210 B1 | 9/2003 | Chau et al. | 438/240 |
| 6,642,131 B2 | 11/2003 | Harada | 438/591 |
| 6,667,246 B2 | 12/2003 | Mitsuhashi et al. | 438/756 |
| 6,743,683 B2 * | 6/2004 | Barns et al. | 438/299 |
| 2002/0024119 A1 | 2/2002 | Tanaka et al. | |
| 2002/0058374 A1 | 5/2002 | Kim et al. | 438/228 |
| 2002/0063299 A1 | 5/2002 | Kamata et al. | |
| 2002/0197790 A1 | 12/2002 | Kizilyalli et al. | 438/240 |
| 2003/0032303 A1 | 2/2003 | Yu et al. | 438/770 |
| 2003/0045080 A1 | 3/2003 | Visokay et al. | 438/591 |
| 2003/0073273 A1 | 4/2003 | Azuma et al. | |
| 2003/0107088 A1 | 6/2003 | Inumiya et al. | |
| 2005/0032325 A1 * | 2/2005 | Bhat et al. | 438/396 |
| 2005/0064663 A1 * | 3/2005 | Saito | 438/275 |

FOREIGN PATENT DOCUMENTS

EP    0 899 784 AZ    3/1999

(Continued)

OTHER PUBLICATIONS

U.S. Appl. No. 10/739,173.*

(Continued)

*Primary Examiner*—Thanh Nguyen
(74) *Attorney, Agent, or Firm*—Rahul D. Engineer

(57) ABSTRACT

A method for making a semiconductor device is described. That method comprises forming a hard mask and an etch stop layer on a patterned sacrificial gate electrode layer. After first and second spacers are formed on opposite sides of that patterned sacrificial layer, the patterned sacrificial layer is removed to generate a trench that is positioned between the first and second spacers. At least part of the trench is filled with a metal layer.

2 Claims, 4 Drawing Sheets

FOREIGN PATENT DOCUMENTS

GB 2 358 737 A 4/2001

OTHER PUBLICATIONS

U.S. Appl. No. 10/742,678.*

International Search Report PCT/US2004/043362.

Polishchuk et al. "Dual Workfunction CMOS Gate Technology Based on Metal Interdiffusion," www.eesc.berkeley.edu, 1 page.

Doug Barlage et al., "High-Frequency Reponse of 100 nm Integrated CMOS Transistors with High-K Gate Dielectrics", 2001 IEEE, 4 pages.

Lu et al., "Dual-Metal Gate Technology for Deep-Submicron CMOS Devices", dated Apr. 29, 2003, 1 page.

Schwantes et al., "Performance Improvement of Metal Gate CMOS Technologies with Gigabit Feature Sizes", Technical University of Hanburg-Harburg, 5 pages.

Doczy et al., "Integrating N-type and P-type Metal Gate Transistors", U.S. Serial No. 10/327,293, Filed Dec. 20, 2002.

Brask et al., "A Method of Making Semiconductor Device Having a High-K Gate Dielectric", U.S. No. 10/387,303, Filed Mar. 11, 2003.

Brask et al., "A Method of Making Semiconductor Device Having a High-K Gate Dielectric", U.S. Serial No. 10/391,816, filed Mar. 18, 2003.

Chau et al., "A Method for Making a Semiconductor Device Having a Metal Gate Electrode", U.S. Serial No. 10/431,166, filed May 6, 2003.

Brask et al. "A Selective Etch Process for Making a Semiconductor Device Having a High-K Gate Dielectric," U.S. Appl. No. 10/652,546, filed Aug. 28, 2003.

Brask et al., "A Method for Making a Semiconductor Device Having a High-K Gate Dielectric," U.S. Appl. No. 10/642,796, filed Aug. 28, 2003.

Brask, "Methods and Compositions for Selectively Etching Metal Films and Structures," U.S. Appl. No. 10/658,225, filed Sep. 8, 2003.

Brask et al., "A Method for Making a Semiconductor Device Having a Metal Gate Electrode", U.S. Appl. No. 10/704,497, Filed Nov. 6, 2003.

Brask et al., "A Method for Etching a Thin Metal Layer", U.S. Appl. No. 10/704,498, Filed Nov. 6, 2003.

Brask et al., "A Method for Making a Semiconductor Device that Includes a Metal Gate Electrode", U.S. Appl. No. Unknown, Filed Dec. 18, 2003.

Brask. "A Method for Making a Semiconductor Device with a Metal Gate Electrode that is Formed on an Annealed High-K Gate Dielectric Layer", U.S. Appl. No. Unknown, Filed Dec. 19, 2003.

International Application No. PCT/US2004/043362, International Preliminary Report on Patentability.

* cited by examiner

METHOD FOR MAKING A SEMICONDUCTOR DEVICE THAT INCLUDES A METAL GATE ELECTRODE

FIELD OF THE INVENTION

The present invention relates to methods for making semiconductor devices, in particular, semiconductor devices with metal gate electrodes.

BACKGROUND OF THE INVENTION

CMOS devices with very thin gate dielectrics made from silicon dioxide may experience unacceptable gate leakage currents. Forming the gate dielectric from certain high-k dielectric materials, instead of silicon dioxide, can reduce gate leakage. Because, however, such a dielectric may not be compatible with polysilicon, it may be desirable to replace polysilicon based gate electrodes with metal gate electrodes in devices that include high-k gate dielectrics.

To form metal NMOS and PMOS gate electrodes that have appropriate workfunctions, it may be necessary to form them from different materials—one that ensures an acceptable workfunction for the NMOS gate electrode, and another that ensures an acceptable workfunction for the PMOS gate electrode. A replacement gate process may be used to form metal NMOS and PMOS gate electrodes from different metals. In that process, a first polysilicon layer, bracketed by a pair of spacers, is removed selectively to a second polysilicon layer to create a trench between the spacers. The trench is filled with a first metal. The second polysilicon layer is then removed, and replaced with a second metal that differs from the first metal.

When using such a replacement gate process to form metal NMOS and PMOS gate electrodes, it may be necessary to form a hard mask on the polysilicon layers to minimize silicide formation, when the transistors' source and drain regions are covered with a silicide. Although such a hard mask may protect the upper surface of the polysilicon layers, the upper corners of those layers may be exposed, when the spacers are formed. Suicide may form at those exposed corners, when the source and drain regions are silicided, which may adversely impact the subsequent polysilicon removal steps.

Accordingly, there is a need for an improved method for making a semiconductor device that includes metal gate electrodes. There is a need for a replacement gate process that replaces polysilicon layers with metal layers, which is not adversely affected by silicide formation on the polysilicon layers. The present invention provides such a method.

Features shown in these figures are not intended to be drawn to scale.

DETAILED DESCRIPTION OF THE PRESENT INVENTION

A method for making a semiconductor device is described. That method comprises forming a patterned sacrificial gate electrode layer that is covered by a hard mask and an etch stop layer. After forming first and second spacers on opposite sides of the patterned sacrificial gate electrode layer, that layer is removed to generate a trench that is positioned between the first and second spacers. At least part of that trench is then filled with a metal layer. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
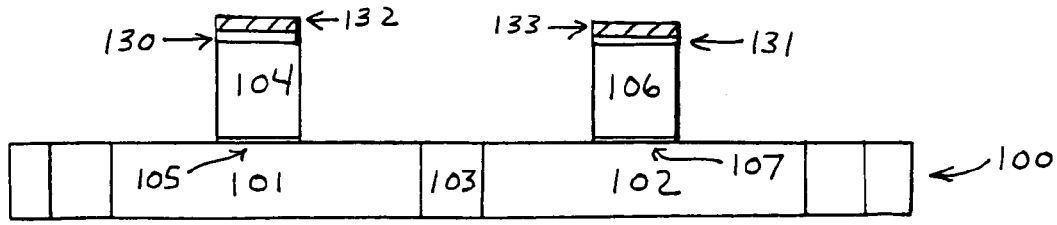
FIGS. 1a–1k represent cross-sections of structures that may be formed when carrying out an embodiment of the method of the present invention.
Figure 1B:
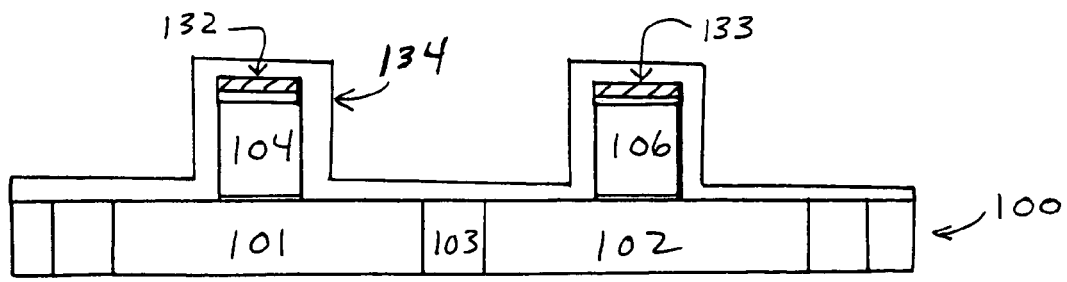

FIGS. 1a–1k illustrate structures that may be formed, when carrying out an embodiment of the method of the present invention. FIG. 1a represents an intermediate structure that may be formed when making a complementary metal oxide semiconductor ("CMOS"). That structure includes first part 101 and second part 102 of substrate 100. Isolation region 103 separates first part 101 from second part 102. First sacrificial gate electrode layer 104 is formed on first gate dielectric layer 105, and second sacrificial gate electrode layer 106 is formed on second gate dielectric layer 107. Hard masks 130, 131 are formed on sacrificial gate electrode layers 104, 106, and etch stop layers 132, 133 are formed on hard masks 130, 131.

Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although a few examples of materials from which substrate 100 may be formed are described here, any material that may serve as a foundation upon which a semiconductor device may be built falls within the spirit and scope of the present invention.

Isolation region 103 may comprise silicon dioxide, or other materials that may separate the transistor's active regions. First gate dielectric layer 105 and second gate dielectric layer 107 may each comprise silicon dioxide, or other materials that may insulate the substrate from the gate electrodes. Dielectric layers 105, 107 preferably comprise a high quality, dense thermally grown silicon dioxide layer that is less than about 20 angstroms thick, and more preferably that is about 10 angstroms thick. Sacrificial gate electrode layers 104, 106 may comprise polysilicon and are preferably between about 100 and about 2,000 angstroms thick, and more preferably between about 500 and about 1,600 angstroms thick.

Hard masks 130, 131 may comprise silicon nitride, and preferably are between about 100 and about 500 angstroms thick—and more preferably between about 200 and about 350 angstroms thick. Etch stop layers 132, 133 may comprise a material that will be removed at a substantially slower rate than silicon nitride will be removed when an appropriate etch process is applied. Etch stop layers 132, 133 may, for example, be made from silicon, an oxide (e.g., silicon dioxide or a metal oxide such as hafnium dioxide), a carbide (e.g., silicon carbide), or a carbon doped silicon nitride. Etch stop layers 132, 133 preferably are between about 200 and about 1,200 angstroms thick, and more preferably are between about 400 and about 600 angstroms thick.

When sacrificial gate electrode layers 104, 106 comprise polysilicon, and hard mask layers 130, 131 comprise silicon nitride, the FIG. 1a structure may be made in the following way. A dielectric layer, which may comprise silicon dioxide, is formed on substrate 100 (e.g., via a conventional thermal growth process), followed by forming a polysilicon layer on the dielectric layer (e.g., via a conventional deposition process). Using conventional deposition techniques, a silicon nitride layer is formed on the polysilicon layer, and an etch stop layer is formed on the silicon nitride layer. The etch stop, silicon nitride, polysilicon, and dielectric layers are then patterned—using conventional lithography and etch processes—to form patterned etch stop layers 132, 133, patterned silicon nitride layers 130, 131, patterned polysilicon layers 104, 106, and patterned dielectric layers 105, 107.

After forming the FIG. 1a structure, spacers are formed on opposite sides of sacrificial gate electrode layers 104, 106. When those spacers comprise silicon nitride, they may be formed in the following way. First, a silicon nitride layer of substantially uniform thickness—preferably less than about 1000 angstroms thick—is deposited over the entire structure, producing the structure shown in FIG. 1b. Conventional deposition processes may be used to generate that structure.

In a preferred embodiment, silicon nitride layer 134 is deposited directly on substrate 100, patterned etch stop layers 132, 133, and opposite sides of sacrificial gate electrode layers 104, 106—without first forming a buffer oxide layer on substrate 100 and layers 104, 106. In alternative embodiments, however, such a buffer oxide layer may be formed prior to forming layer 134. Similarly, although not shown in FIG. 1b, a second oxide may be formed on layer 134 prior to etching that layer. If used, such an oxide may enable the subsequent silicon nitride etch step to generate an L-shaped spacer.

Figure 1C:
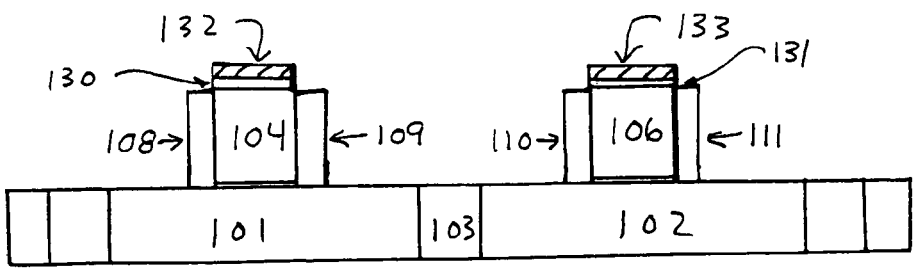

Silicon nitride layer 134 may be etched using a conventional process for anisotropically etching silicon nitride to create the FIG. 1c structure. Etch stop layers 132, 133 prevent such an anisotropic etch step from removing hard masks 130, 131, when silicon nitride layer 134 is etched—even when hard masks 130, 131 comprise silicon nitride. As a result of that etch step, sacrificial gate electrode layer 104 is bracketed by a pair of sidewall spacers 108, 109, and sacrificial gate electrode layer 106 is bracketed by a pair of sidewall spacers 110, 111.

As is typically done, it may be desirable to perform multiple masking and ion implantation steps to create lightly implanted regions near layers 104, 106 (that will ultimately serve as tip regions for the device's source and drain regions), prior to forming spacers 108, 109, 110, 111 on sacrificial gate electrode layers 104, 106. Also as is typically done, the source and drain regions may be formed, after forming spacers 108, 109, 110, 111, by implanting ions into parts 101 and 102 of substrate 100, followed by applying an appropriate anneal step. Part of those source and drain regions may then be converted to a silicide using well known process steps. Etch stop layers 132, 133 will prevent such a process sequence from converting a meaningful part, if any, of sacrificial gate electrode layers 104, 106 to a silicide.

When sacrificial gate electrode layers 104, 106 comprise polysilicon, an ion implantation and anneal sequence used to form n-type source and drain regions within part 101 of substrate 100 may dope polysilicon layer 104 n-type at the same time. Similarly, an ion implantation and anneal sequence used to form p-type source and drain regions within part 102 of substrate 100 may dope polysilicon layer 106 p-type. When doping polysilicon layer 106 with boron, that layer should include that element at a sufficient concentration to ensure that a subsequent wet etch process, for removing n-type polysilicon layer 104, will not remove a significant amount of p-type polysilicon layer 106.

Figure 1D:
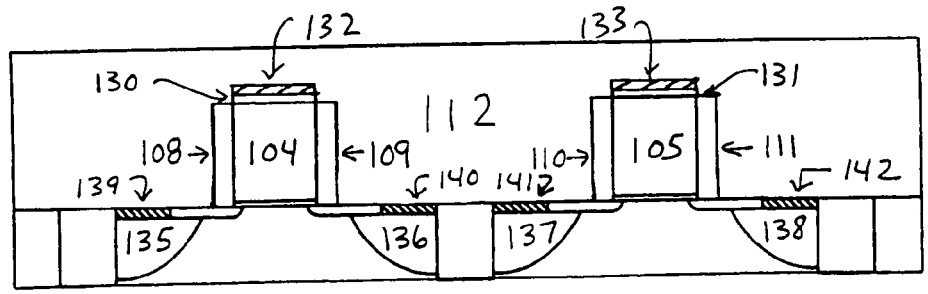

After forming spacers 108, 109, 110, 111, dielectric layer 112 may be deposited over the device, generating the FIG. 1d structure. Dielectric layer 112 may comprise silicon dioxide, or a low-k material. Dielectric layer 112 may be doped with phosphorus, boron, or other elements, and may be formed using a high density plasma deposition process. By this stage of the process, source and drain regions 135, 136, 137, 138, which are capped by silicided regions 139, 140, 141, 142, have already been formed. Conventional process steps, materials, and equipment may be used to generate the structures represented by FIGS. 1a–1d, as will be apparent to those skilled in the art. Those structures may include other features—not shown, so as not to obscure the method of the present invention—that may be formed using conventional process steps.

Figure 1E:
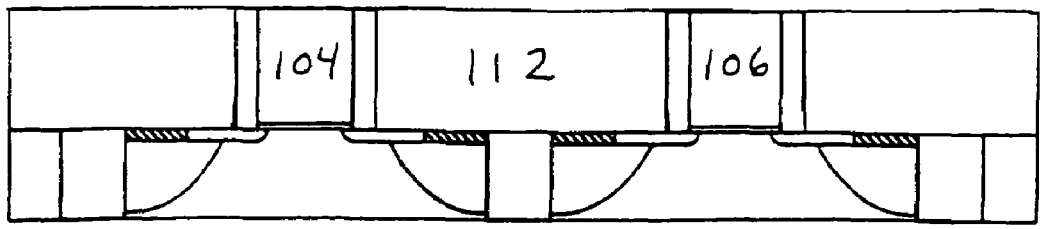

Dielectric layer 112 is removed from patterned etch stop layers 132, 133, which are, in turn, removed from hard masks 130, 131, which are, in turn, removed from patterned sacrificial gate electrode layers 104, 106, producing the FIG. 1e structure. A conventional chemical mechanical polishing ("CMP") operation may be applied to remove that part of dielectric layer 112, patterned etch stop layers 132, 133, and hard masks 130, 131. Etch stop layers 132, 133 and hard masks 130, 131 must be removed to expose patterned sacrificial gate electrode layers 104, 106. Etch stop layers 132, 133 and hard masks 130, 131 may be polished from the surface of layers 104, 106, when dielectric layer 112 is polished—as they will have served their purpose by that stage in the process.

Figure 1F:
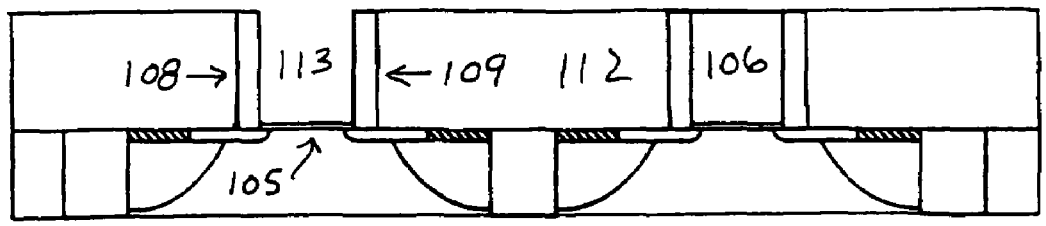

After forming the FIG. 1e structure, sacrificial gate electrode layer 104 is removed to generate trench 113 that is positioned between sidewall spacers 108, 109—producing the structure shown in FIG. 1f. In a preferred embodiment, a wet etch process that is selective for layer 104 over sacrificial gate electrode layer 106 is applied to remove layer 104 without removing significant portions of layer 106.

When sacrificial gate electrode layer 104 is either undoped or doped n-type, and sacrificial gate electrode layer 106 is doped p-type (e.g., with boron), such a wet etch process may comprise exposing sacrificial gate electrode layer 104 to an aqueous solution that comprises a source of hydroxide for a sufficient time at a sufficient temperature to remove substantially all of layer 104. That source of hydroxide may comprise between about 2 and about 30 percent ammonium hydroxide or a tetraalkyl ammonium hydroxide, e.g., tetramethyl ammonium hydroxide ("TMAH"), by volume in deionized water.

Sacrificial gate electrode layer 104 may be selectively removed by exposing it to a solution, which is maintained at a temperature between about 15° C. and about 90° C. (and preferably below about 40° C.), that comprises between about 2 and about 30 percent ammonium hydroxide by volume in deionized water. During that exposure step, which preferably lasts at least one minute, it may be desirable to apply sonic energy at a frequency of between about 10 KHz and about 2,000 KHz, while dissipating at between about 1 and about 10 watts/cm$^2$.

In a particularly preferred embodiment, sacrificial gate electrode layer 104, with a thickness of about 1,350 angstroms, may be selectively removed by exposing it at about 25° C. for about 30 minutes to a solution that comprises about 15 percent ammonium hydroxide by volume in deionized water, while applying sonic energy at about 1,000 KHz—dissipating at about 5 watts/cm$^2$. Such an etch process should remove substantially all of an n-type polysilicon layer without removing a meaningful amount of a p-type polysilicon layer.

As an alternative, sacrificial gate electrode layer 104 may be selectively removed by exposing it for at least one minute to a solution, which is maintained at a temperature between about 60° C. and about 90° C., that comprises between about 20 and about 30 percent TMAH by volume in deionized water, while applying sonic energy. Removing sacrificial gate electrode layer 104, with a thickness of about 1,350 angstroms, by exposing it at about 80° C. for about 2 minutes to a solution that comprises about 25 percent TMAH by volume in deionized water, while applying sonic energy at about 1,000 KHz—dissipating at about 5 watts/$cm^2$—may remove substantially all of layer 104 without removing a significant amount of layer 106.

Figure 1G:
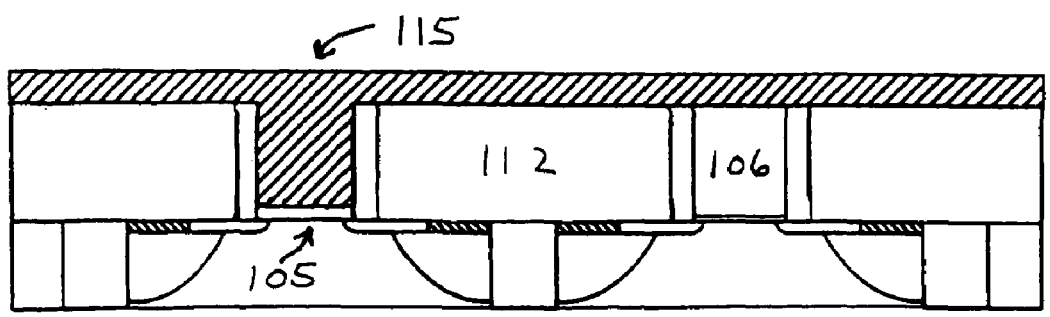

In this embodiment, after removing sacrificial gate electrode layer 104, first gate dielectric layer 105, which may comprise silicon dioxide, is retained—followed by forming n-type metal layer 115 on layer 105 to fill trench 113 and to generate the FIG. 1g structure. N-type metal layer 115 may comprise any n-type conductive material from which a metal NMOS gate electrode may be derived. N-type metal layer 115 preferably has thermal stability characteristics that render it suitable for making a metal NMOS gate electrode for a semiconductor device.

Figure 1H:
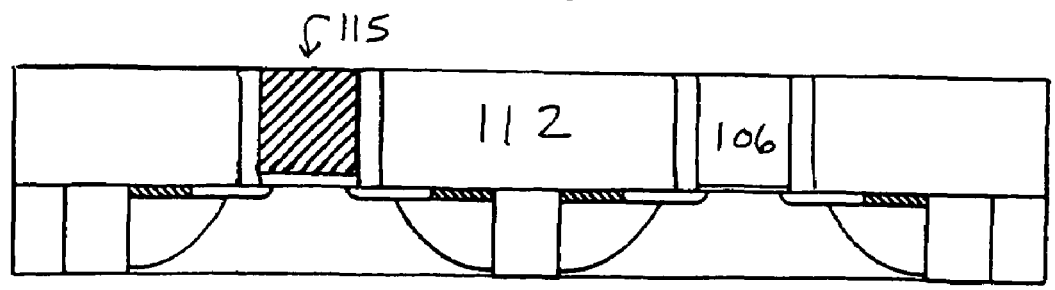

Materials that may be used to form n-type metal layer 115 include: hafnium, zirconium, titanium, tantalum, aluminum, and their alloys, e.g., metal carbides that include these elements, i.e., hafnium carbide, zirconium carbide, titanium carbide, tantalum carbide, and aluminum carbide. N-type metal layer 115 may be formed on first gate dielectric layer 105 using well known PVD or CVD processes, e.g., conventional sputter or atomic layer CVD processes. As shown in FIG. 1h, n-type metal layer 115 is removed except where it fills trench 113. Layer 115 may be removed from other portions of the device via a wet or dry etch process, or an appropriate CMP operation. Dielectric 112 may serve as an etch or polish stop, when layer 115 is removed from its surface.

N-type metal layer 115 preferably serves as a metal NMOS gate electrode that has a workfunction that is between about 3.9 eV and about 4.2 eV, and that is between about 100 angstroms and about 2,000 angstroms thick, and more preferably is between about 500 angstroms and about 1,600 angstroms thick. Although FIGS. 1g and 1h represent structures in which n-type metal layer 115 fills all of trench 113, in alternative embodiments, n-type metal layer 115 may fill only part of trench 113, with the remainder of the trench being filled with a material that may be easily polished, e.g., tungsten or aluminum. In such an alternative embodiment, n-type metal layer 115, which serves as the workfunction metal, may be between about 50 and about 1,000 angstroms thick—and more preferably at least about 100 angstroms thick.

In embodiments in which trench 113 includes both a workfunction metal and a trench fill metal, the resulting metal NMOS gate electrode may be considered to comprise the combination of both the workfunction metal and the trench fill metal. If a trench fill metal is deposited on a workfunction metal, the trench fill metal may cover the entire device when deposited, forming a structure like the FIG. 1g structure. That trench fill metal must then be polished back so that it fills only the trench, generating a structure like the FIG. 1h structure.

Figure 1I:
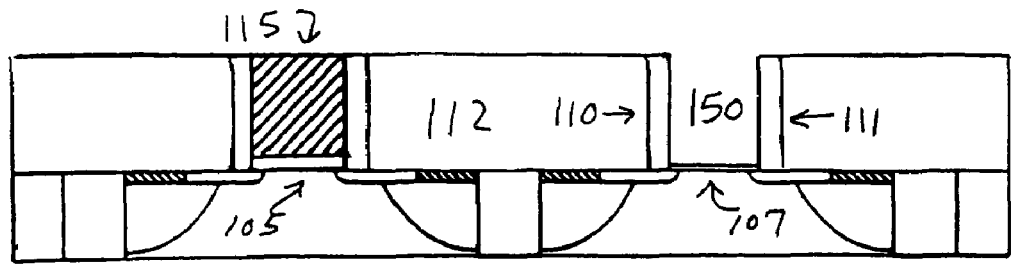

In the illustrated embodiment, after forming n-type metal layer 115 within trench 113, sacrificial gate electrode layer 106 is removed to generate trench 150 that is positioned between sidewall spacers 110, 111—producing the structure shown in FIG. 1i. In a preferred embodiment, layer 106 is exposed to a solution that comprises between about 20 and about 30 percent TMAH by volume in deionized water for a sufficient time at a sufficient temperature (e.g., between about 60° C. and about 90° C.), while applying sonic energy, to remove all of layer 106 without removing significant portions of n-type metal layer 115.

Alternatively, a dry etch process may be applied to selectively remove layer 106. When sacrificial gate electrode layer 106 is doped p-type (e.g., with boron), such a dry etch process may comprise exposing sacrificial gate electrode layer 106 to a plasma derived from sulfur hexafluoride ("$SF_6$"), hydrogen bromide ("HBr"), hydrogen iodide ("HI"), chlorine, argon, and/or helium. Such a selective dry etch process may take place in a parallel plate reactor or in an electron cyclotron resonance etcher.

Figure 1J:
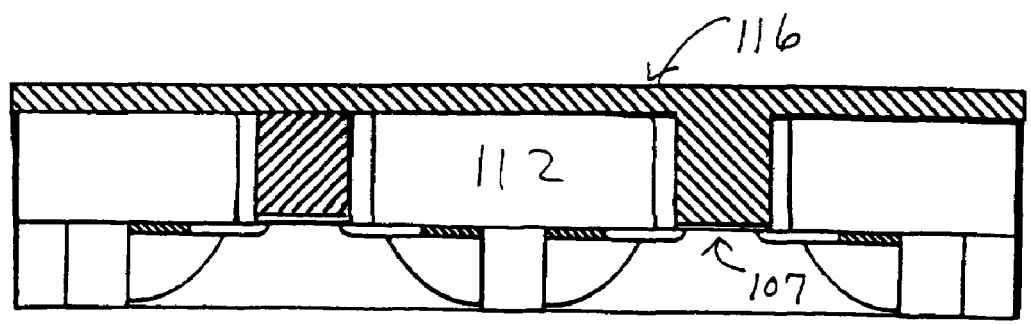

In this embodiment, after removing sacrificial gate electrode layer 106, second gate dielectric layer 107, which may comprise silicon dioxide, is retained—followed by forming p-type metal layer 116 on layer 107 to fill trench 150 and to generate the FIG. 1j structure. P-type metal layer 116 may comprise any p-type conductive material from which a metal PMOS gate electrode may be derived. P-type metal layer 116 preferably has thermal stability characteristics that render it suitable for making a metal PMOS gate electrode for a semiconductor device.

Figure 1K:
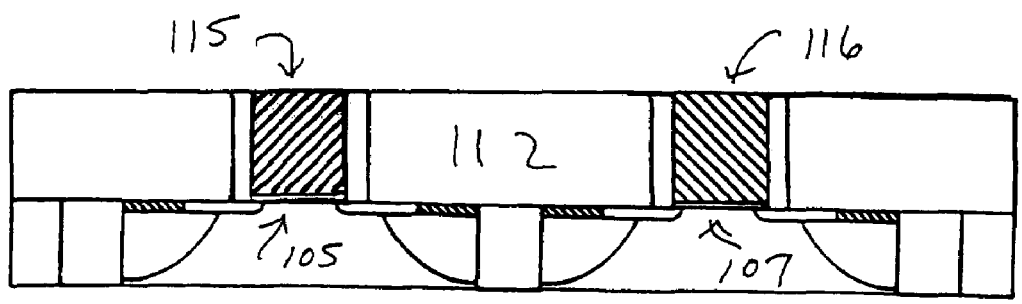

Materials that may be used to form p-type metal layer 116 include: ruthenium, palladium, platinum, cobalt, nickel, and conductive metal oxides, e.g., ruthenium oxide. P-type metal layer 116 may be formed on second gate dielectric layer 107 using well known PVD or CVD processes, e.g., conventional sputter or atomic layer CVD processes. As shown in FIG. 1k, p-type metal layer 116 is removed except where it fills trench 150. Layer 116 may be removed from other portions of the device via a wet or dry etch process, or an appropriate CMP operation, with dielectric 112 serving as an etch or polish stop.

P-type metal layer 116 may serve as a metal PMOS gate electrode with a workfunction that is between about 4.9 eV and about 5.2 eV, and that is between about 100 angstroms and about 2,000 angstroms thick, and more preferably is between about 500 angstroms and about 1,600 angstroms thick.

Although FIGS. 1j and 1k represent structures in which p-type metal layer 116 fills all of trench 150, in alternative embodiments, p-type metal layer 116 may fill only part of trench 150. As with the metal NMOS gate electrode, the remainder of the trench may be filled with a material that may be easily polished, e.g., tungsten or aluminum. In such an alternative embodiment, p-type metal layer 116, which serves as the workfunction metal, may be between about 50 and about 1,000 angstroms thick. Like the metal NMOS gate electrode, in embodiments in which trench 150 includes a workfunction metal and a trench fill metal, the resulting metal PMOS gate electrode may be considered to comprise the combination of both the workfunction metal and the trench fill metal.

Although a few examples of materials that may be used to form metal layers 115 and 116 are described here, those metal layers may be made from many other materials, as will be apparent to those skilled in the art. After removing metal layer 116, except where it fills trench 150, a capping dielectric layer may be deposited onto dielectric layer 112, metal NMOS gate electrode 115, and metal PMOS gate electrode 116, using any conventional deposition process. Process steps for completing the device that follow the deposition of such a capping dielectric layer, e.g., forming the device's contacts, metal interconnect, and passivation layer, are well known to those skilled in the art and will not be described here.

Figure 2A:
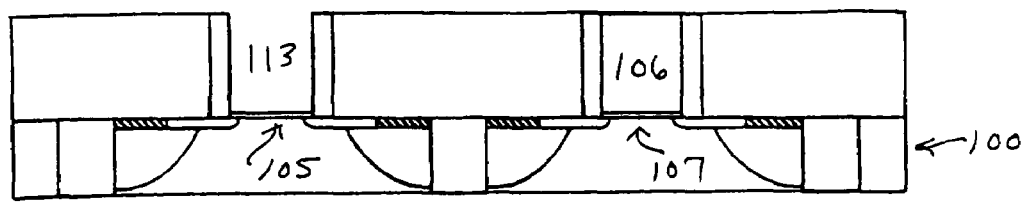
FIGS. 2a–2c represent cross-sections of structures that may be formed when carrying out an alternative embodiment of the method of the present invention.
Figure 2B:
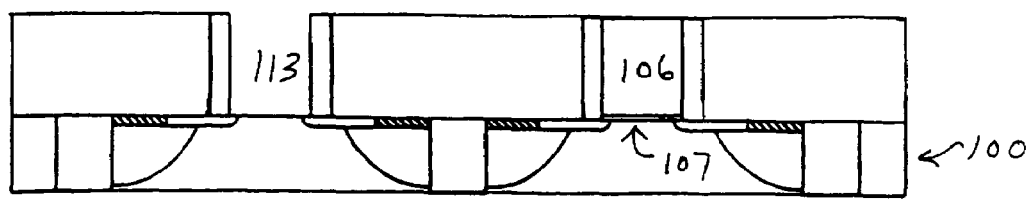
Figure 2C:
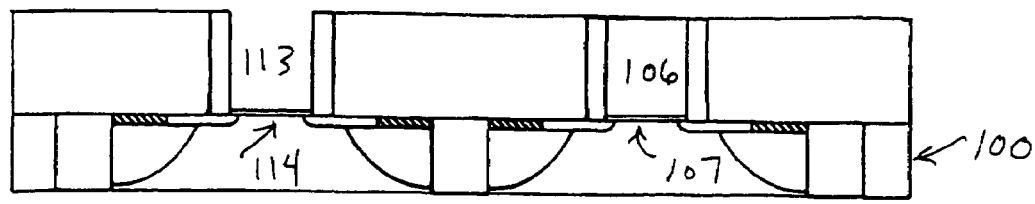

FIGS. 1a–1k illustrate an embodiment in which first and second gate dielectric layers 105, 107 are retained after layers 104, 106 are removed. FIGS. 2a–2c illustrate an alternative embodiment, in which first gate dielectric layer 105 is removed after removing sacrificial gate electrode layer 104, and second gate dielectric layer 107 is removed after removing sacrificial gate electrode layer 106. FIG. 2a represents the device after layer 104 is removed. That structure may be identical to the FIG. 1f structure. In this alternative embodiment, first gate dielectric layer 105 is removed after sacrificial gate electrode layer 104 is removed.

When first gate dielectric layer 105 comprises silicon dioxide, it may be removed using an etch process that is selective for silicon dioxide to generate the FIG. 2b structure. Such etch processes include: exposing layer 105 to a solution that includes about 1 percent HF in deionized water, or applying a dry etch process that employs a fluorocarbon based plasma. Layer 105 should be exposed for a limited time, as the etch process for removing layer 105 may also remove part of dielectric layer 112. With that in mind, if a 1 percent HF based solution is used to remove layer 105, the device preferably should be exposed to that solution for less than about 60 seconds, and more preferably for about 30 seconds or less.

When first gate dielectric layer 105 is removed, it must be replaced prior to forming an n-type metal layer within trench 113. Preferably, high-k gate dielectric layer 114 is formed on substrate 100 at the bottom of trench 113, after first gate dielectric layer 105 has been removed—generating the structure illustrated by FIG. 2c. Some of the materials that may be used to make high-k gate dielectric 114 include: hafnium oxide, hafnium silicon oxide, lanthanum oxide, zirconium oxide, zirconium silicon oxide, tantalum oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form high-k gate dielectric layer 114 are described here, that layer may be made from other materials.

High-k gate dielectric layer 114 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and high-k gate dielectric layer 114. The CVD reactor should be operated long enough to form a layer with the desired thickness. In most applications, high-k gate dielectric layer 114 should be less than about 60 angstroms thick, and more preferably between about 5 angstroms and about 40 angstroms thick.

Although not shown in FIG. 2c, if an atomic layer CVD process is used to form high-k gate dielectric layer 114, that layer may form on the sides of trench 113 in addition to forming on the bottom of that trench. If high-k gate dielectric layer 114 comprises an oxide, it may manifest oxygen vacancies at random surface sites and unacceptable impurity levels, depending upon the process used to make it. It may be desirable to remove certain impurities from layer 114, and to oxidize it to generate a layer with a nearly idealized metal:oxygen stoichiometry, after layer 114 is deposited.

Likewise, second gate dielectric layer 107 may be replaced with a high-k dielectric layer after sacrificial gate electrode layer 106 is removed and before p-type metal layer 116 fills trench 150. The method described above enables production of CMOS devices that include metal NMOS and PMOS gate electrodes without causing significant amounts of silicide to form on the polysilicon layers, which must be removed prior to forming the metal gate electrodes. Although the embodiments described above provide examples of processes for forming such devices, the present invention is not limited to these particular embodiments.

Although the foregoing description has specified certain steps and materials that may be used in the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:
   forming a first dielectric layer on a substrate;
   forming a polysilicon containing layer on the first dielectric layer;
   forming a first silicon nitride layer on the polysilicon containing layer;
   forming an etch stop layer on the first silicon nitride layer;
   etching the etch stop layer, the first silicon nitride layer, the polysilicon containing layer, and the first dielectric layer, to form a patterned etch stop layer, a patterned first silicon nitride layer, a patterned polysilicon containing layer, and a patterned first dielectric layer;
   depositing a second silicon nitride layer on the substrate, the patterned etch stop layer, and on opposite sides of the patterned polysilicon containing layer;
   removing the second silicon nitride layer from part of the substrate and from the patterned etch stop layer to form first and second spacers on opposite sides of the patterned polysilicon containing layer;
   forming source and drain regions that comprise a silicide next to the first and second spacers;
   forming a second dielectric layer on the patterned etch stop layer and on the substrate;
   removing the second dielectric layer from the patterned etch stop layer;
   removing the patterned etch stop layer from the patterned first silicon nitride layer;
   removing the patterned first silicon nitride layer from the patterned polysilicon containing layer;
   removing the patterned polysilicon containing layer to generate a trench that is positioned between the first and second spacers; and
   filling at least part of the trench with a metal layer.

2. The method of claim 1 wherein:
   the first dielectric layer is between about 5 and about 20 angstroms thick;

the polysilicon containing layer is between about 100 and about 2,000 angstroms thick;

the first silicon nitride layer is between about 100 and about 500 angstroms thick;

the etch stop layer is between about 200 and about 1,200 angstroms thick; and the metal layer serves as a workfunction metal that fills only part of the trench and is between about 50 and about 1,000 angstroms thick; and further comprising depositing on the metal layer a trench fill material.

* * * * *